United States Patent
Scheikl

(10) Patent No.: US 7,034,600 B2
(45) Date of Patent: Apr. 25, 2006

(54) METHOD AND APPARATUS FOR EMC-OPTIMIZED ACTUATION OF A SEMICONDUCTOR SWITCHING ELEMENT

(75) Inventor: Erich Scheikl, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/419,594

(22) Filed: Apr. 21, 2003

(65) Prior Publication Data

US 2004/0021498 A1 Feb. 5, 2004

(30) Foreign Application Priority Data

Apr. 19, 2002 (DE) .................. 102 17 611

(51) Int. Cl.
*H03K 17/04* (2006.01)
(52) U.S. Cl. ............... 327/376; 327/377; 327/108
(58) Field of Classification Search ........... 327/108, 327/538, 539, 424, 369, 427, 512, 541
See application file for complete search history.

(56) References Cited

U.S. PATENT DOCUMENTS

| 5,828,245 | A  | * | 10/1998 | Brambilla et al. | ........... 327/108 |
| 5,939,909 | A  | * | 8/1999  | Callahan, Jr.    | ............... 327/108 |
| 6,556,407 | B1 | * | 4/2003  | Brando et al.    | ............... 361/100 |
| 6,570,413 | B1 | * | 5/2003  | Kumagai et al.   | ........... 327/108 |
| 2001/0040470 | A1 | | 11/2001 | Brando et al. | |

FOREIGN PATENT DOCUMENTS

| DE | 198 55 604 C1 | 6/2000 |
| WO | 00/27032 | 5/2000 |

* cited by examiner

*Primary Examiner*—Tuan T. Lam
*Assistant Examiner*—Hiep Nguyen
(74) *Attorney, Agent, or Firm*—Laurence A. Greenberg; Werner H. Stemer; Ralph E. Locher

(57) ABSTRACT

A semiconductor switching element has a control connection and a load path, with the load path connected in series with a load and a supply voltage is applied across the series circuit. The semiconductor switching element is actuated by providing a first charging current at the control connection, and providing a second charging current at the first control connection, which is greater than the first charging current, when a voltage which is applied across the load path is less than a first threshold value, with the threshold value being between 20% and 80% of the supply voltage.

9 Claims, 5 Drawing Sheets

FIG 4

|     | SS | KS1 | L1 | L2 | E1 | E2 |
|-----|----|----|----|----|----|----|
| ON  | 1  | 1  | 1  | 0  | 0  | 0  |
| ON  | 1  | 0  | 0  | 1  | 0  | 0  |
| OFF | 0  | 0  | 0  | 0  | 1  | 0  |
| OFF | 0  | 1  | 0  | 0  | 0  | 1  |

FIG 6A

|    | SS | KS2 | KS1 | L1 | L2 | L3 |
|----|----|----|----|----|----|----|
| ON | 1  | 0  | 1  | 0  | 0  | 1  |
| ON | 1  | 0  | 0  | 0  | 0  | 1  |
| ON | 1  | 1  | 1  | 1  | 0  | 0  |
| ON | 1  | 1  | 0  | 0  | 1  | 0  |

FIG 6B

| SS | KS3 | KS1 | E1 | E2 | E3 |
|----|----|----|----|----|----|
| 0  | 0  | 1  | 0  | 0  | 1  |
| 0  | 0  | 0  | 0  | 0  | 1  |
| 0  | 1  | 1  | 1  | 0  | 0  |
| 0  | 1  | 0  | 0  | 1  | 0  |

METHOD AND APPARATUS FOR EMC-OPTIMIZED ACTUATION OF A SEMICONDUCTOR SWITCHING ELEMENT

BACKGROUND OF THE INVENTION

Field of the Invention

The present invention relates to a method and an apparatus for EMC-optimized (EMC=Electromagnetic Compatibility) actuation of a semiconductor switching element which is connected in series with a load, with a supply voltage being applied across the series circuit. The semiconductor switching element is, in particular, in the form of a MOS transistor.

Electromagnetic interference radiation occurs in circuit configurations such as this when the semiconductor switching element is changed very quickly from a switched-off state to a switched-on state, or from a switched-on state to a switched-off state, so that a voltage which is applied across the load path of the semiconductor switching element, or a current flowing through the load path, has steep flanks.

An EMC-compatible method for actuating a semiconductor switching element in the form of a MOS transistor is described in German Patent DE 198 55 604 C1, corresponding to U.S. Pat. No. 6,556,407. The known method provides for the semiconductor switching element to be switched on and for a first charging current to be provided initially until a load current is greater than a first lower threshold value. A second charging current is then provided, which is less than the first charging current, as a result of which the load current rises slowly without the voltage across the load path of the semiconductor switching element falling noticeably if the load is inductive with a freewheeling diode. As soon as the load path voltage of the semiconductor switching element falls below the value of a threshold voltage which is more than 90% of the supply voltage (for example 13 V in the case of a 14 V supply voltage), the first greater charging current is provided once again. The threshold voltage is chosen, approximately, such that the second, greater charging current is provided as soon as the load current has approximately reached its maximum value.

In order to switch the semiconductor switch off, with the known method, a first discharge current is provided until the load path voltage reaches a threshold value which is greater than 90% of the supply voltage (for example 13 V for a 14 V supply voltage) and after which the load current starts to fall. A smaller discharge current is then provided until the load current has fallen below a predetermined current threshold.

However, in the known method, only the current flank is optimized, by reducing the charging current or discharging current, respectively, when the load current is rising or falling. The voltage flank is ignored.

SUMMARY OF THE INVENTION

It is accordingly an object of the invention to provide a method and an apparatus for EMC-optimized actuation of a semiconductor switching element that overcome the above-mentioned disadvantages of the prior art methods and devices of this general type.

With the foregoing and other objects in view there is provided, in accordance with the invention, a method for actuating a semiconductor switching element having a control connection and a load path. The load path is connected in series with a load defining a series circuit and a supply voltage is applied across the series circuit. The method includes the following steps for switching on the semiconductor switching element: providing a first charging current at the control connection; and providing a second charging current at the control connection, being greater than the first charging current, when a voltage across the load path is less than a given threshold value, with the given threshold value being between 20% and 80% of the supply voltage.

The method according to the invention makes use of the knowledge that the load path voltage of a semiconductor switching element has an exponential profile while the semiconductor switching element changes from a switched-off state to a switched-on state with a charging current which is constant for the entire discharging process, that is to say it is initially steep and then becomes increasingly flatter. In the method according to the invention, in which a smaller first charging current is selected first and in which a larger charging current is chosen only once the load path voltage has fallen below a voltage threshold in the range between 20% and 80% of the supply voltage, it is possible to achieve a load path voltage with a time profile which is considerably flatter than the steep section of an approximately exponential profile, and is considerably steeper than the flat section of an exponential profile.

The method according to the invention, which influences the decrease in the load path voltage in the stated manner, can be used for both inductive and resistive loads connected in series with the semiconductor switching element.

With regard to the time profile of the load current, it should be noted that, in the case of inductive loads, the load current will have risen approximately to the maximum value even before the output voltage falls below the threshold value. The smaller first charging current is thus available at the control connection throughout the entire time that the load current is rising. In the case of resistive loads, the rise in the output current is directly dependent on the decrease in the load path voltage, so that the gradient of the current flank is also influenced by influencing the gradient of the voltage flank, namely by making it steeper in flat sections and flatter in steep sections than in the case of actuation with a charging current that is constant all the time.

The first threshold value, at which switching takes place from the lower charging current to a higher charging current, is preferably between 40% and 60% of the supply voltage.

One embodiment of the invention provides for the threshold value to be variable as a function of the load that is connected in series with the semiconductor switching element.

When the semiconductor switching element is switched on, a third charging current is preferably produced at the control connection before the first charging current is applied, with the third charging current being greater than the first charging current and being greater than or equal to the second charging current, and being applied until the load current exceeds a predetermined threshold value, which indicates that the semiconductor switching element is starting to conduct. This makes it possible to shorten the switching period, that is to say the time period between the start of the application of a charging current and the time at which the semiconductor switching element is completely switched on.

The method according to the invention for switching off a semiconductor switching element which has a control connection and a load path, with the load path being connected in series with a load and with a supply voltage being applied across the series circuit, envisages the provision of a first discharge current at the control connection first, and then the provision of a second discharge current at the first control connection, which is less than the first discharge current, when a voltage which is produced across the load path is greater than a second threshold value, with the threshold value being between 20% and 80% of the supply voltage.

The load path voltage threshold value which is chosen for switching off, and at which switching takes place from the first discharge current to the second discharge current, may correspond to the first threshold value for the switched-on state, at which switching takes place from the first charging current to the second charging current.

The method according to the invention for switching off makes use of the knowledge that the load path voltage of a semiconductor switching element has an at least approximately exponential profile, that is to say it is initially flat and then becomes increasingly steeper, when the semiconductor switching element changes from a switched-on state to a switched-off state with a charging current which is constant for the entire discharge process. In the method according to the invention, in which a greater first discharge current is selected first and in which a smaller charging current is selected only when the load path voltage has fallen below a voltage threshold in the range between 20% and 80% of the supply voltage, it is possible to achieve a load path voltage time profile which is considerably flatter than the steep section of an exponential profile, and is considerably steeper than the flat section of an exponential profile.

With regard to the time profile of the load current, it should be noted that, in the case of inductive loads, the load current starts to fall only after the output voltage becomes greater than the threshold value or when the load path voltage has already approximately reached its maximum value. Throughout the entire time during which the load current is falling, the smaller second discharge current is thus available at the control connection. In the case of resistive loads, the decrease in the load current is directly dependent on the rise of the load path voltage, so that the gradient of the current flank is also influenced by influencing the gradient of the voltage flank, namely by steepening it in flat sections and flattening it in steep sections in comparison to actuation with a charging current which is always constant.

The second threshold value, at which switching takes place from the higher discharge current to the lower discharge current, is preferably between 40% and 60% of the supply voltage.

One embodiment of the invention provides for the threshold value to be variable as a function of the load that is connected in series with the semiconductor switching element.

When the semiconductor switching element is switched off, a third discharge current is preferably provided at the control connection before the first discharge current is applied, with this third discharge current being greater than the first discharge current and being applied until the load path voltage is greater than a predetermined threshold value which indicates that the semiconductor switching element is starting to switch off. The switching period, that is to say the time period between the start of the application of a discharge current and the semiconductor switching element switching off completely, can thus be shortened.

With the foregoing and other objects in view there is provided, in accordance with the invention, a circuit configuration. The circuit configuration contains a load, and a semiconductor switching element connected in series with the load defining a series circuit and has a control connection and a load path. The series circuit receives a supply voltage. An actuating circuit is provided and contains a first terminal for providing a first logic potential, a second terminal for providing a second logic potential, a first current source connected between the first terminal and the control connection, a second current source connected between the first terminal and the control connection, a third current source connected between the control connection and the second terminal, a fourth current source connected between the control connection and the second terminal, and an actuating logic unit having outputs connected to and actuating the first, second, third and fourth current sources. The actuating logic unit has an input receiving a switching signal. A comparator configuration receives a signal dependent on an output voltage across the load path of the semiconductor switching element and a reference signal having a value between 20% and 80% of the supply voltage. The comparator configuration has an output connected to the actuating logic unit and outputs a comparison signal received by the actuating logic unit. The actuating logic unit actuates the first, second, third and fourth current sources in dependence on the switching signal and the comparison signal.

In accordance with an added feature of the invention, the actuating circuit further contains a fifth current source connected between the first terminal and the control connection, and a second comparator configuration receiving a signal that is dependent on a load current and a reference signal. The second comparator configuration outputs a second comparison signal. The second comparison signal is supplied to the actuating logic unit, and the actuating logic unit actuates the fifth current source in dependence on the switching signal and on the second comparison signal.

In accordance with another feature of the invention, the actuating circuit further contains a sixth current source connected between the control connection and the second terminal, and a third comparator configuration receiving a signal that is dependent on the output voltage and a further reference signal. The third comparator configuration outputs a third comparison signal and the third comparison signal is supplied to the actuating logic unit. The actuating logic unit actuates the sixth current source in dependence on the switching signal and the third comparison signal.

Other features which are considered as characteristic for the invention are set forth in the appended claims.

Although the invention is illustrated and described herein as embodied in a method and an apparatus for EMC-optimized actuation of a semiconductor switching element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a table showing the levels of the input and output signals of the actuating circuit shown in FIG. 3;

FIGS. 6A and 6B are tables showing the levels of the input and output signals of the actuating circuit shown in FIG. 5.

DESCRIPTION OF THE PREFERRED EMBODIMENTS

Figure 1:
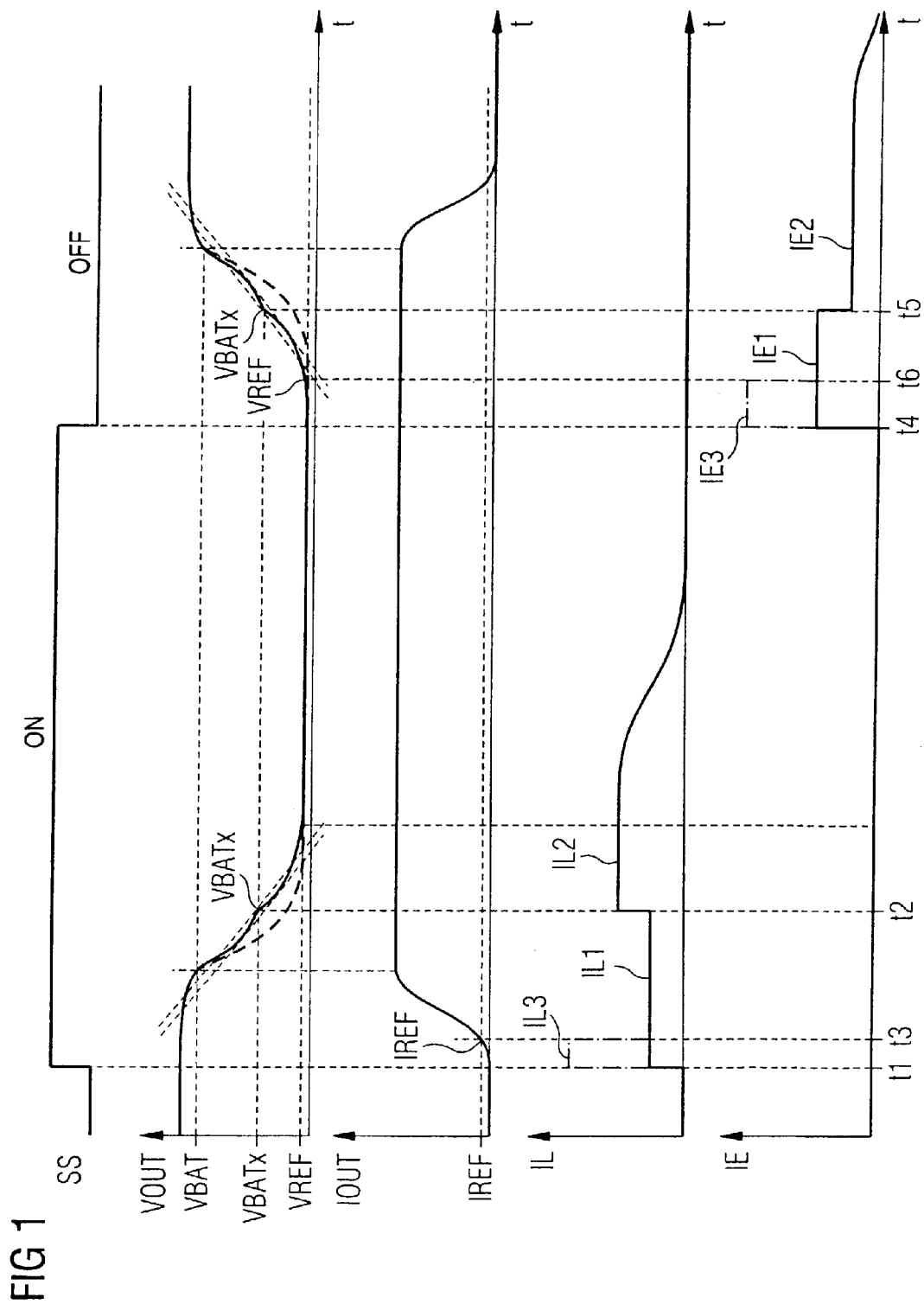
FIG. 1 shows timing profiles of a load path voltage, a load current, and charging and discharge currents when a semiconductor switching element which is connected in series with an inductive load is switched on and off according to the invention.

Unless stated to the contrary, identical reference symbols denote identical parts with the same meaning in the figures. The method according to the invention will be explained first on the basis of timing profiles of a load path voltage, a load current and charging and discharge currents on actuation of a semiconductor switching element connected in series with a load. Referring now to the figures of the drawing in detail and first, particularly, to FIG. 1 thereof, there is shown a timing diagram of an inductive load connected in series with the semiconductor switching element, and FIG. 2 shows a timing diagram of a resistive load connected in series with the semiconductor switching element.

Figure 3:
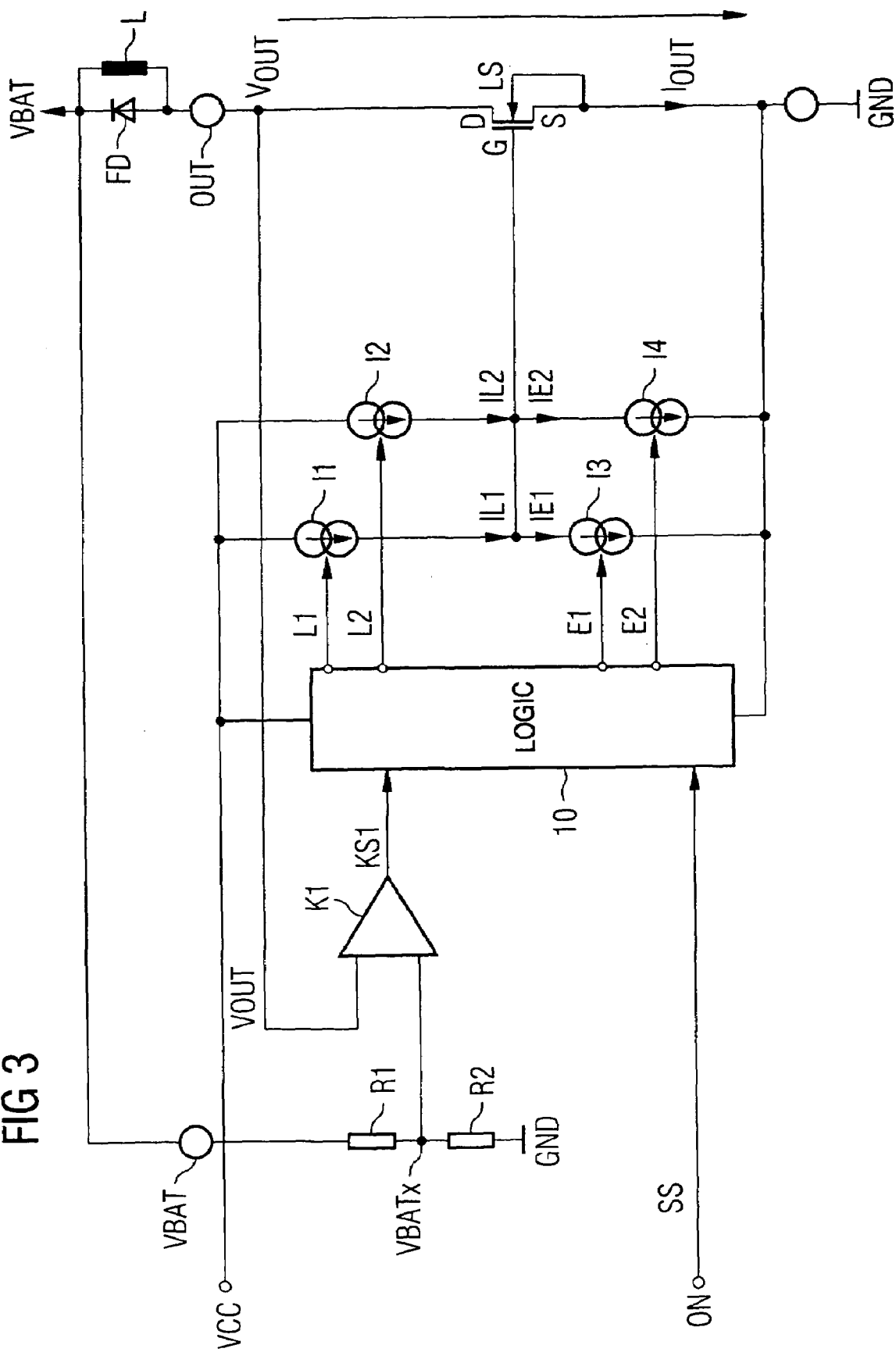
FIG. 3 is a circuit diagram of the semiconductor switching element connected in series with a load and an actuating circuit according to a first embodiment for the semiconductor switching element.
Figure 5:
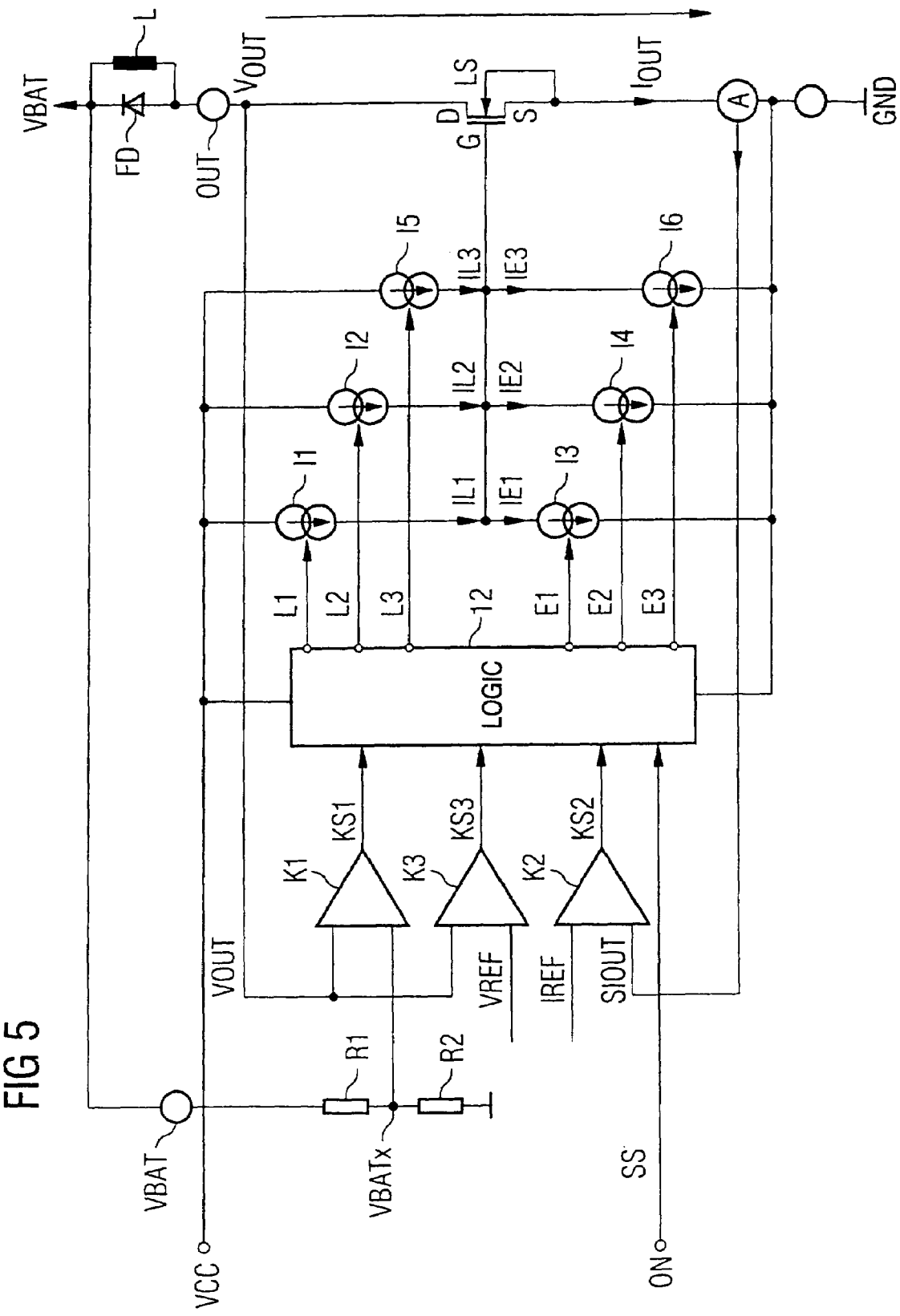
FIG. 5 is a circuit diagram of the semiconductor switching element connected in series with the load and the actuating circuit according to a second embodiment for the semiconductor switching element.

FIGS. 3 and 5 each show series circuits such as those with a semiconductor switching element in the form of an MOS transistor LS, whose drain-source path D-S is connected in series with an inductive load L with a freewheeling diode FD. A supply voltage VBAT is applied to the load L, FD and to the transistor LS via the series circuit. The load path voltage (drain-source voltage) of the transistor is denoted VOUT. The power transistor LS is used for switching the load, with a gate electrode G of the power transistor LS being charged with a predetermined charging current IL in order to switch it on, and with its gate electrode G being discharged with a predetermined discharge current IE in order to switch the power transistor LS off. The magnitudes of the charging and discharge currents govern the gradients of the switching flanks of the output voltage VOUT and of the output current IOUT, and they are thus the most important influencing variables for EMC-compatible actuation of the power transistor LS.

Figure 2:
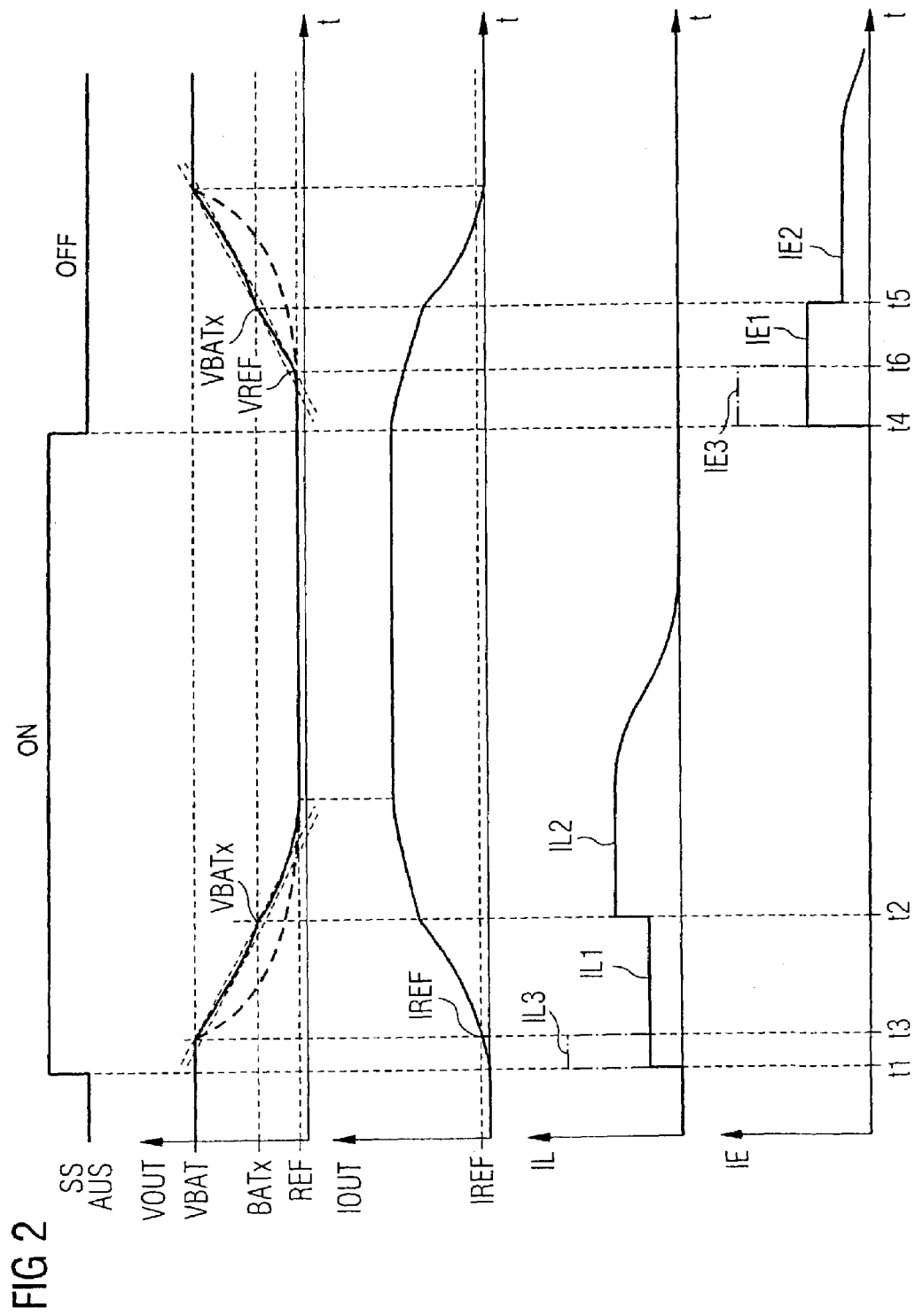
FIG. 2 shows various timing profiles of the load path voltage, the load current, and the charging and discharge currents when the semiconductor switching element which is connected in series with a resistive load is switched on and off.

FIG. 1 shows comparative illustrations of the time profiles of a switching signal SS, which determines whether the power transmitter LS should be switched off or on, of the load path voltage VOUT of the power transistor LS, of the load path current IOUT of the power transistor LS, of the charging current IL and of the discharge current IE when the transistor LS which is connected in series with an inductive load is actuated. Corresponding time profiles for the switching of a transistor that is connected in series with a resistive load are illustrated in a comparative form in FIG. 2.

In the method according to the invention, a first charging current IL1 is provided initially in order to switch the power transistor LS on. The charging current starts at a time t1, at which the switching signal changes to a high level. The gate electrode G of the power transistor G is charged by the first charging current IL1 until the output voltage VOUT has fallen to the value of a threshold voltage VBATx, which is between 20% and 80% of the supply voltage VBAT, preferably between 40% and 60% of the supply voltage VBAT.

After reaching the threshold at a time t2, the gate electrode G is charged by a second charging current IL2, which is greater than the first charging current IL1. Towards the end of the charging process, the second charging current IL2 is forced to decrease when the power transistor LS is switched on completely and the gate capacitance of the power transistor LS is completely charged.

The method according to the invention results in the output voltage VOUT having an approximately linear profile between an upper voltage value of the output voltage VOUT when the power transistor LS is in the switched off state, and a lower value of the output voltage VOUT when the power transistor LS is in the fully switched-on state, in which case the upper value of the output voltage VOUT may be greater than the value of the supply voltage VBAT if the load is inductive.

The profiles of the output voltage VOUT, which are shown by dashed lines in FIGS. 1 and 2, show time profiles when a constant charging current is applied to the gate electrode G. In this case, the output voltage profile VOUT has an exponential profile in the ideal case, that is to say it is initially steep and then becomes increasingly flatter, with the profile illustrated by dashed lines corresponding approximately to the profile which is achieved with a charging current that is between the first charging current IL1 and the second charging current IL2. With the method according to the invention, the profile also has an exponential profile in the individual sections, but is flattened in the first section owing to the lower charging current IL1 and is steeper in the second section owing to the greater charging current IL2, so that the voltage profile which results from this runs largely within a range which runs through two parallel straight lines with the same gradient, which are shown by dashed lines in the figures, so that the voltage profile can be regarded as a good approximation to a linear voltage profile between the extreme values of the output voltage VOUT.

As can be seen from FIG. 1, the output current IOUT with an inductive load and with the transistor LS switched on has already risen approximately to its maximum value when the load path voltage VOUT of the power transistor LS reaches the value of the supply voltage BVAT. The rise in the load current IOUT thus takes place entirely within the time interval within which the power transistor LS is being charged with the first charging current IL1. The gradient of the current rise is dependent on the charging current IL1, with the profile of the current rise becoming slower the lower the charging current IL1.

In order to switch the power transistor LS, discharging takes place with a first discharging current IE1 from a time t4, from which the switching signal SS assumes a low level, until the load path voltage VOUT reaches the value of a threshold voltage VBATx, which is between 20% and 80% of the supply voltage VBAT, and preferably between 40% and 60% of the supply voltage VBAT, at a time t5. The threshold voltage VBATx of the load path voltage VOUT when switching off the power transistor may match the threshold volume when switching on the power transistor. After reaching the threshold voltage VBATX, a second discharging current IE2 is provided, which is less than the first discharge current IE1. The second discharge current IE2 is forced to decrease toward the end of the discharging process, once the power transistor LS has switched off completely, that is to say with its gate capacitance being completely discharged.

The magnitude of the first charging current IL1 may match the magnitude of the second discharge current IE2, and the magnitude of the second charging current IL2 may match the magnitude of the first discharge current IE1.

In the method according to the invention for switching off the power transistor LS—as for switching it on as well—an approximately linear profile is achieved between the minimum value and the maximum value of the load path voltage VOUT. FIGS. 1 and 2 use dashed lines to show the time profile of the output voltage VOUT while the gate capacitance is being discharged at a constant discharge current, which is between the first discharge current IE1 and the second discharge current IE2.

In contrast, the time profile for the method according to the invention is steeper in the first section due to the greater discharge current IE1, and is flatter in the second section due to the smaller discharge current IE2, so that the two sections, which are each intrinsically exponential, lie largely within second parallel straight lines with the same gradient, which are shown by dashed lines in the figures, adjacent to the profile of the output voltage VOUT.

When an inductive load is connected, the load current IOUT does not start to fall until the voltage VOUT across the load reaches, or exceeds, the value of the supply voltage VBAT.

The approximately linear profile of the output voltage VOUT results in any electromagnetic interference radiation produced during switching, both when the power transistor LS is switched on and when it is switched off, being reduced to less than an exponential profile.

One embodiment of the method according to the invention provides for the gate capacitance to be charged with a large charging current IL3 when the transistor LS is switched on, with the charging current IL3 being greater than the first charging current IL1 and greater than the second charging current IL2 as well. The charging current IL3 is applied until the load current IOUT is greater than the value of a reference current IREF, which indicates that the power transistor LS is starting to conduct. Only then is the smaller first load current IL1 applied, until the output voltage VOUT reaches the value of the reference voltage VBATx. The time profile of the larger current IL3 is indicated by a dashed line in FIG. 1, with the total time from the time t1 until the power transistor LS is switched off completely being shortened when using an initially large charging current until the transistor starts to conduct, although this is not illustrated in FIG. 1.

In a corresponding manner, when the power transistor LS is switched off, its gate capacitance is discharged with a large discharge current IE3, which is greater than the first discharge current IE1, until the output voltage reaches the value of a reference voltage VREF. Only then does the discharging process continue with the first discharge current IE1, which is less than the initial discharge current IE3. The initially large discharge current IE3 which is applied until the power transistor starts to conduct results in the overall switching time being shortened, although this is not shown in FIG. 1 or FIG. 2.

The profile of the output voltage VOUT when connected to a resistive load, as is illustrated in FIG. 2, corresponds essentially to the time profile when connected to an inductive load, although the output voltage VOUT in the case of a resistive load cannot, of course, exceed the value of the supply voltage VBAT.

There are major differences with regard to the load currents. In the case of the inductive load, the current has already risen approximately to its maximum value before the load path voltage VOUT falls below the value of the supply voltage VBAT, and when the power transistor LS is switched off, the load current IOUT does not decrease until the load path voltage VOUT has already risen above the value of the supply voltage VBAT.

In the resistive case, the load path voltage VOUT and the output voltage IOUT are directly related to one another, with the output voltage IOUT being given by:

$$IOUT=(VBAT-VOUT)/R,$$

with R as the resistance of the resistive load. The magnitudes of the gradients of the load path voltage VOUT and of the load current IOUT which govern the EMC radiated interference are thus proportional to one another, with the gradient of the output voltage VOUT having an approximately linear profile with the method according to the invention.

In addition to the series circuit formed by the semiconductor switch LS and the load L, FD, FIG. 3 shows an actuating circuit for actuating the power transistor LS by the method according to the invention. The actuating circuit has first and second current sources I1, I2, which are connected between an upper logic potential VCC and the gate connection G of the power transistor LS. Furthermore, a third and a fourth current source I3, I4 are provided, and are connected between the gate connection G and a lower logic potential, which corresponds to the reference ground potential GND. The current sources I3 to I4 are actuated by actuating logic 10, which is supplied with the switching signal SS and with a comparison signal KS1 which is provided by a comparator configuration K1 in the form of a comparator. The comparator K1 compares the load path voltage of the power transistor LS with a reference voltage VBATx. The power transistor LS in the exemplary embodiment shown in FIG. 3 operates as a low side switch, that is to say it is connected between the load and a lower voltage potential, or the reference ground potential GND. The reference voltage VBATx is in this example provided by a voltage divider R1, R2, which is connected between the upper supply voltage VBAT and the lower supply potential GND. The voltage divider with the two resistors R1, R2 is configured such that the reference voltage VBATx has a value which is between 20% and 80% of the supply voltage VBAT, and is preferably between 40% and 60% of the supply voltage VBAT.

In an embodiment that is not shown in any more detail, one of the two resistors in the voltage divider is variable, in order in this way to make it possible to adjust the reference voltage VBATx. The resistor is in this case set as a function of the connected load, in order to make it possible in this way to adjust the reference voltage as a function of the load, as is envisaged in one embodiment of the invention.

The actuating logic 10 provides an actuating signal L1 for the first current source I1, an actuating signal L2 for the second current source I2, an actuating signal E1 for the third current source I3, and an actuating signal E2 for the fourth current source I4, as a function of the comparison signal KS1 and the switching signal SS.

The method of operation of the actuating logic 10 will be explained in the following text with reference to the logic table in FIG. 4, with the left-hand part of the logic table showing values of the switching signal SS and of the comparison signal KS1, and the right-hand part showing values of the output signals L1, L2, E1, E2. It is assumed that the respective current source is actuated when its actuating signal L1, L2, E1, E2 assumes the value of a logic 1, and that the respective current source is not actuated when its actuating signal assumes the value of a logic 0.

The comparator configuration K1 is configured such that the comparison signal KS1 assumes the value of logic 1 as long as the load path voltage VOUT is less than the reference voltage VBATx. The switching signal SS is logic 1 when the transistor LS is intended to be switched on, and is a logic 0 when the transistor is intended to be switched off.

The first current source I1 is actuated in order to supply the first discharge current IL1 to the gate connection G when the switching signal SS assumes a logic 1 and the comparison signal KS1 likewise assumes a logic 1, that is to say when the output voltage VOUT is less than the reference voltage VBATX. The current source I2 is actuated, in order to supply the second charging current IL2, when the switching signal is logic 1 and the first comparison signal KS1 is logic 0. It is also feasible, for actuating the second current source I2, for this to be actuated in each case by the inverted actuating signal from the first current source I1. In a corresponding way, the first current source I1 can be actuated using the inverted actuating signal from the current source I2.

The gate capacitance of the power transistor LS is discharged when the switching signal assumes a logic 0, with the third current source I3 being actuated in order to supply the first discharge current IE1 when the comparison signal KS1 assumes a logic 0, that is to say when the load path voltage VOUT is less than the threshold voltage VBATx. When the comparison signal KS1 assumes the value of a logic 1, then the fourth current source I4 is actuated, in order to discharge the gate capacitance by the second discharge current IE2.

Actuating logic with the actuating signals SS and KS1 and the output signals L1, L2, El, E2, satisfying the logic table illustrated in FIG. 4, can be achieved by normal logic gates in any desired manner.

FIG. 5 shows a further embodiment of an actuating circuit, in which a fifth current source I5 is connected between the positive logic potential VCC and the gate connection G, and a sixth current source I6 is connected between the gate connection G and the lower logic potential GND. The actuating circuit also has a second comparator configuration K2, which is supplied with a reference signal IREF and with a signal SIOUT which is dependent on the load current IOUT and is produced by a current measurement configuration A. The second comparator configuration K2 provides a second comparison signal KS2 for actuating logic 12 which, in comparison to the actuating logic 10 shown in FIG. 4, has an additional input and two additional outputs.

Furthermore, a third comparator configuration K3 is provided, which compares the load path voltage VOUT with a further reference voltage VREF. The third comparator configuration K3 provides a third comparison signal KS3. The actuating logic produces an actuating signal L3 in order to actuate the fifth current source I5, and the actuating logic 12 produces an actuating signal E3 in order to actuate the sixth current source I6.

The fifth current source I5 is actuated when the power transistor LS is "switched on" as a function of the switching signal SS, of the first comparison signal KS1 and of the second comparison signal KS2, with the second comparison signal KS2 assuming a logic 0 as long as the signal SIOUT which is dependent on the load current IOUT is less than the reference value IREF.

The actuation of the current sources I1, I2, I3, which are responsible for switching on the power transistor LS, using the actuating logic 10 is clearly illustrated in the logic table shown in FIG. 6A, in which the process of switching on is indicated by the fact that the switching signal SS assumes a logic 1. The fifth current source I5 is actuated independently of the value of the first comparison signal KS1, in order to produce the charging current IL3, as long as the second comparison signal KS2 assumes the value of a logic 0. If the load current IOUT exceeds a predetermined threshold, that is to say if the second comparison signal KS2 assumes the value of a logic 1, then the fifth current source I5 is switched off, and the first and the second current source I1, I2 are actuated in the manner explained above as a function of the switching signal SS and of the first comparison signal KS1.

The method of operation of the actuating logic 12 when the power switch LS is switched off is shown clearly in the logic table illustrated in FIG. 6B, with the switching-off process being identified by the fact that the switching signal SS assumes a logic 0. The sixth current source I6 is actuated in order to discharge the gate capacitance by the third discharge current I3 for as long as the third comparison signal KS3 assumes a logic 0, and for as long as the load path voltage or the output voltage VOUT is less than the reference value VREF. After this, the sixth current source I6 is switched off via the actuating signal E3, and the third and fourth current sources are actuated as a function of the switching signal SS and of the first comparison signal KS1, in the manner already explained above.

I claim:

1. A method for actuating a semiconductor switching element having a control connection and a load path, the load path being connected in series with a load defining a series circuit and a supply voltage being applied across the series circuit, which comprises the following steps for switching on the semiconductor switching element:
   providing a first charging current at the control connection; and
   providing a second charging current at the control connection, being greater than the first charging current, when a voltage across the load path is less than a given threshold value, with the given threshold value being between 40% and 60% of the supply voltage.

2. The method according to claim 1, which further comprises choosing the given threshold value in dependence on the load.

3. The method according to claim 1, which further comprises before providing the first charging current, providing a third charging current until a current flowing through the load path of the semiconductor switching element falls below a given current threshold.

4. A method for actuating a semiconductor switching element having a control connection and a load path, the load path being connected in series with a load defining a series circuit and a supply voltage being applied across the series circuit, which comprises the following method steps for switching off the semiconductor switching element:
   providing a first discharge current at the control connection;
   providing a second discharge current at the control connection, being less than the first discharge current, when a voltage across the load path is greater than a given threshold value, with the given threshold value being between 40% and 60% of the supply voltage.

5. The method according to claim 4, which further comprises choosing the given threshold value in dependence on the load.

6. The method according to claim 4, which further comprises before providing the first discharge current, providing a third discharge current until a voltage dropped across the load path of the semiconductor switching element is greater than a further threshold value.

7. A circuit configuration, comprising:
a load;
a semiconductor switching element connected in series with said load defining a series circuit and having a control connection and a load path, said series circuit receiving a supply voltage; and
an actuating circuit, containing:
a first terminal for providing a first logic potential;
a second terminal for providing a second logic potential;
a first current source connected between said first terminal and said control connection;
a second current source connected between said first terminal and said control connection;
a third current source connected between said control connection and said second terminal;
a fourth current source connected between said control connection and said second terminal;
an actuating logic unit having outputs connected to and actuating said first, second, third and fourth current sources, said actuating logic unit having an input receiving a switching signal; and
a comparator configuration receiving a signal dependent on an output voltage across said load path of said semiconductor switching element and a reference signal having a value between 40% and 60% of the supply voltage, said comparator configuration having an output connected to said actuating logic unit and outputting a comparison signal received by said actuating logic unit, said actuating logic unit actuating said first, second, third and fourth current sources in dependence on the switching signal and the comparison signal.

8. The circuit configuration according to claim 7, wherein said actuating circuit further contains:
a fifth current source connected between said first terminal and said control connection; and
a second comparator configuration receiving a signal that is dependent on a load current and a reference signal, said second comparator configuration outputting a second comparison signal, the second comparison signal being supplied to said actuating logic unit, and said actuating logic unit actuating said fifth current source in dependence on the switching signal and on the second comparison signal.

9. The circuit configuration according to claim 8, wherein said actuating circuit further contains:
a sixth current source connected between said control connection and said second terminal; and
a third comparator configuration receiving a signal that is dependent on the output voltage and a further reference signal, said third comparator configuration outputting a third comparison signal and the third comparison signal being supplied to said actuating logic unit, and said actuating logic unit actuating said sixth current source in dependence on the switching signal and the third comparison signal.

* * * * *